(12) United States Patent
Peng

(10) Patent No.: US 6,235,435 B1
(45) Date of Patent: May 22, 2001

(54) DICHROIC PHOTO MASK AND METHODS FOR MAKING AND INSPECTING SAME

(75) Inventor: Song Peng, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/395,899

(22) Filed: Sep. 14, 1999

(51) Int. Cl.[7] ................. G03F 9/00; G06K 9/00
(52) U.S. Cl. ................................. 430/5; 382/144
(58) Field of Search .................. 430/5, 322, 394, 430/30; 382/144

(56) References Cited

U.S. PATENT DOCUMENTS

| | | | |
|---|---|---|---|
| 5,508,132 | 4/1996 | Komatsu | 430/5 |
| 5,538,816 | 7/1996 | Hashimoto et al. | 430/5 |
| 5,631,109 | 5/1997 | Ito | 430/5 |
| 5,691,090 | 11/1997 | Isao et al. | 430/5 |
| 5,721,075 | 2/1998 | Hashimoto et al. | 430/5 |
| 5,725,975 | 3/1998 | Nakamura et al. | 430/5 |
| 5,770,335 | 6/1998 | Miyake et al. | 430/5 |
| 5,804,338 | 9/1998 | Lim et al. | 430/5 |
| 6,103,430 | * 8/2000 | Yang | 430/5 |
| 6,110,623 | * 8/2000 | O'Grady | 430/5 |

* cited by examiner

*Primary Examiner*—S. Rosasco
(74) *Attorney, Agent, or Firm*—Schmeiser, Olsen & Watts; Howard J. Walter, Jr.

(57) ABSTRACT

A dichroic phase shift photo mask (20) is formed by forming a dichroic film (24) over a transparent substrate (11) and selectively etching the dichroic film (24) to form phase shifters (35, 38) of the mask (20). Typically, the mask (20) also includes light blocking structures (34, 36, 37, 39) over the substrate (11). The dichroic film (24) has a high transmittance to a light used in a photolithography process, during which the phase shifters (35, 38) generate interference patterns and significantly increase the image resolution of the light blocking structures (34, 36, 37, 39). The dichroic film (24) has a low transmittance to a light used in inspecting the mask (20). The inspection of the mask (20) includes illuminating the mask (20) with a light beam, and identifying the phase shifters (35, 38) by observing the intensity of the light transmitted through the mask (20).

25 Claims, 3 Drawing Sheets

DICHROIC PHOTO MASK AND METHODS FOR MAKING AND INSPECTING SAME

FIELD OF THE INVENTION

The present invention relates, in general, to photolithography and, more particularly, to phase shift photo masks used in photolithography processes.

BACKGROUND OF THE INVENTION

Photolithography is an essential process in semiconductor device and integrated circuit fabrications. Because of their high resolution, phase shift photo masks are often used in fabricating semiconductor devices and integrated circuits of fine size. FIG. 1 shows a schematic cross sectional view of a phase shift photo mask 10 suitable for a photolithography process in the fabrication of fine size semiconductor devices and integrated circuits. Phase shift photo mask 10 is formed from an optically transparent substrate 11. Opaque light blocking structures 14, 16, 17, and 19 are formed on a major surface 12 of substrate 11. Typically, substrate 11 is made of quartz glass and light blocking structures are chromium structures. Structures 14, 16, 17, and 19 define a pattern to be transferred to a semiconductor wafer in the photolithography process. Substrate 11 is selectively etched to form depressions or cavities 15 and 18. Cavity 15 changes the optical thickness of substrate 11 there under. Consequently, the lights transmitted through substrate 11 near two opposite sides of light blocking structure 14 have a phase shift of 180 degrees relative to each other. This 180° phase shift creates an interference pattern on the semiconductor wafer and significantly increases the image resolution of light blocking structure 14 on the semiconductor wafer. Cavity 15 also increases the image resolution of light blocking structure 16. Likewise, cavity 18 increases the image resolutions of light blocking structures 17 and 19. Cavities 15 and 18 are also referred to as phase shifters.

A way of achieving high quality, reliability, and yield of the photolithography processes is inspecting photo mask 10, and repairing or discarding photo mask 10 if it has defects. Photo mask 10 is usually inspected using an optical microscope. Because quartz glass is colorless and transparent to light over a wide spectrum, the light transmittance of substrate 11 is nearly 100 percent and substantially independent of its thickness. Therefore, determining the existence, location, and dimension of cavities 15 and 18 on substrate 11 is difficult and time consuming. The inspection of photo mask 10 is complicated and often fails to accurately reveal the status and condition of phase shifters 15 and 18 on photo mask 10.

Accordingly, there exists a need for a phase shift photo mask that can be easily and accurately inspected for possible defects. There is also a need for methods of making and inspecting such a phase shift photo mask. It is desirable for the methods to be simple and cost efficient. It is also desirable for the phase shift photo mask to be compatible with existing photolithography processes.

SUMMARY OF THE INVENTION

A general advantage of the present invention is providing a phase shift photo mask that can be easily and accurately inspected for possible defects. A specific advantage of the present invention is providing a photo mask having phase shifting patterns that can be easily identified during an inspection of the photo mask. Another advantage of the present invention is providing a method for forming such a photo mask. Yet another advantage of the present invention is providing a process for inspecting the photo mask and identifying the phase shifting patterns thereon.

These and other advantages of the present invention are achieved through a dichroic phase shift photo mask formed by forming a dichroic film over a major surface of a transparent substrate and selectively etching the dichroic film to form the phase shifting patterns of the photo mask. Typically, the photo mask also includes light blocking structures over the transparent substrate. The dichroic film is etched on one side of a light blocking structure. The dichroic film preferably has high transmittance to a light used in a photolithography process that transfers the pattern on the photo mask to an object such as, for example, a semiconductor wafer. During the photolithography process, the phase shifters generate an interference pattern on the semiconductor wafer and significantly increase the image resolution of light blocking structures on the semiconductor wafer. On the other hand, the dichroic film has a low transmittance to a light used for inspecting the photo mask. The inspection process of the photo mask includes illuminating the photo mask with a light beam, and identifying the phase shifting patterns by observing the light transmitted through the photo mask. Specifically, an area through which a high intensity of light is transmitted is identified as an area where the dichroic film is etched to form phase shifters. On the other hand, an area through which a low intensity of light is transmitted is identified as an area where the dichroic film is not etched. This inspection process for identifying phase shifters on the photo mask is simple, accurate, and cost efficient.

Figure 1:
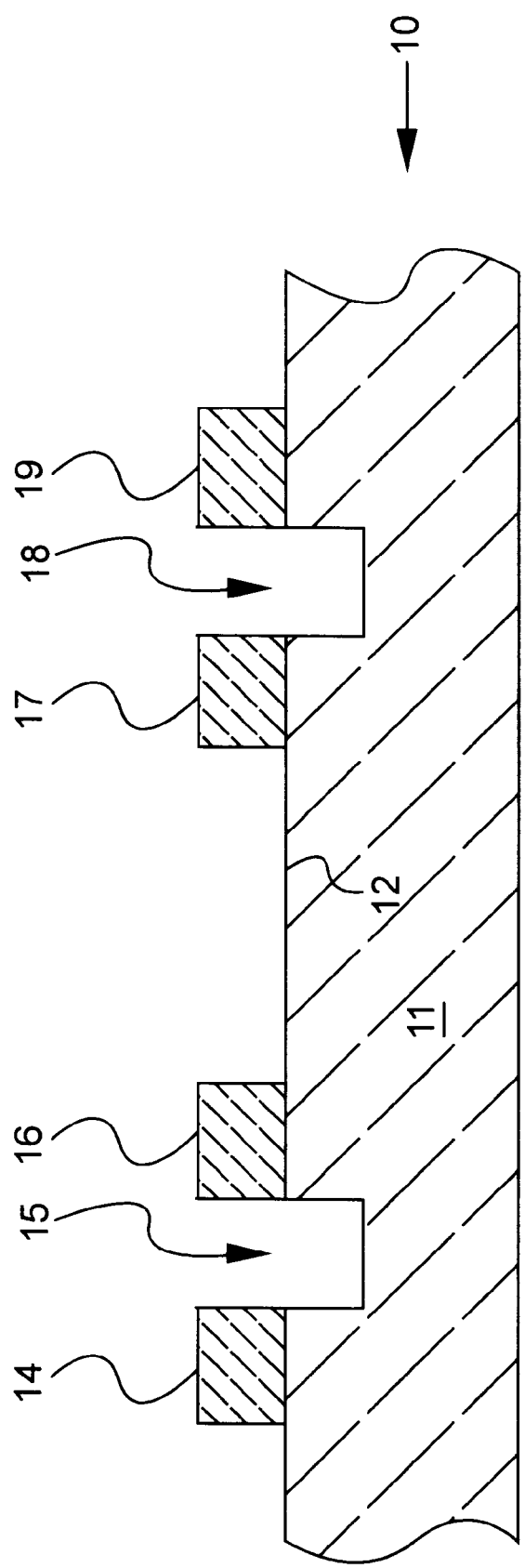
FIG. 1 is a cross sectional view of a conventional phase shift photo mask.

It should be noted that the figures are merely schematic representations, which are not intended to portray specific parameters of the present invention. The figures should not be considered as limiting the scope of the present invention. In addition, the figures are not drawn to scale. Elements having similar functions are labeled using the same reference numerals in the figures.

DETAILED DESCRIPTION OF THE PREFERRED EMBODIMENTS

Generally, the present invention provides a dichroic photo mask, a method for making the dichroic photo mask, and a method for inspecting the dichroic photo mask. The dichroic photo mask of the present invention is compatible with existing photolithography processes and can be used in a way similar to that of conventional phase shift photo mask 10 shown in FIG. 1. When the dichroic photo mask is inspected in accordance with the present invention, the phase shifting patterns on the photo mask can be easily identified by observing the intensity of light transmitted through the photo mask.

Figure 2:
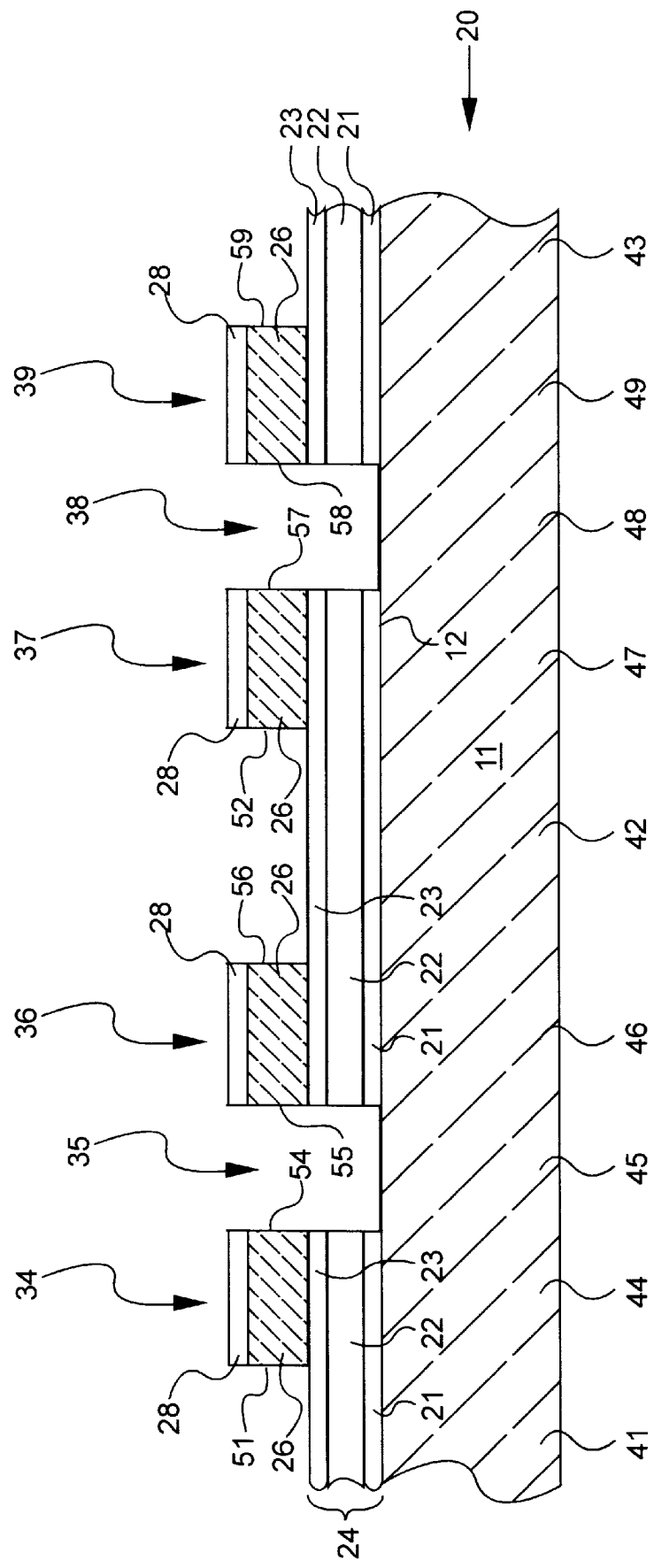
FIG. 2 is a schematic cross sectional view of a dichroic photo mask in accordance with the present invention.

FIG. 2 schematically illustrates, in a cross sectional view, a dichroic photo mask 20 in accordance with the present invention. Photo mask 20 includes a substrate 11 having a major surface 12. Preferably, substrate 11 is made of a transparent material of a high optical quality such as, for example, quartz glass. In other words, substrate 11 can be a quarts glass plate. A dichroic layer or film 24 is disposed over major surface 12 of substrate 11. Dichroic film 24 has a transmittance that depends on the frequency or wavelength of the light. Specifically, dichroic film 24 preferably has a high transmittance, e.g., higher than 90 percent (%), to a light, e.g., a deep ultraviolet light having a wavelength of approximately 248 nanometers (nm), used in a photolithography process for transferring patterns on photo mask 20 to a target object, e.g., a semiconductor wafer (not shown). On the other hand, dichroic film 24 preferably has a low transmittance, e.g., lower than 60%, to a light, e.g., an ultraviolet light having a wavelength of approximately 365 nm, used in inspecting photo mask 20. Opaque or light blocking structures 34, 36, 37, and 39 are formed on dichroic film 24. To form light blocking structures 34, 36, 37, and 38, an opaque layer 26 is disposed on dichroic film 24. In a preferred embodiment, opaque layer 26 is a layer of chromium. A chromium oxide layer 28 is formed on chromium layer 26 and serves to reduce the reflectivity of light blocking structures 34, 36, 37, and 39 during the photolithography process. Chromium oxide layer 28 can be formed by oxidizing chromium layer 26. By way of example, chromium layer 26 has a thickness between approximately 40 nm and approximately 80 nm, and chromium oxide layer 28 has a thickness between approximately 15 nm and approximately 40 nm. Using techniques known in the art. e.g., etching, chromium oxide layer 28 and chromium layer 26 are patterned to form light blocking structures 34, 36, 37, and 39, which are also referred to as blocks 34, 36, 37, and 39, respectively. Light blocking structures 34, 36, 37, and 39 typically define a integrated circuit pattern to be transferred on a semiconductor wafer during a photolithography process.

Dichroic film 24 is then selectively etched to form depression 35 adjacent blocks 34 and 36, and depression 38 adjacent blocks 37 and 39. In a preferred embodiment, dichroic film 24 is completely etched away in depressions 35 and 38, thereby exposing major surface 12 overlying sections 45 and 48 of substrate 11. In this embodiment, photo mask 20 has dichroic film 24 over sections 41, 42, 43, 44, 46, 47, and 49 of substrate 11. Sections 41, 42, 43, 44, 45, 46, 47, 48, and 49 are also referred to as respective portions of substrate 11. Block 34 overlying section 44 of substrate 11 has edges 51 and 54 on the opposite sides thereof. Section 44 separates sections 41 and 45 of substrate 11 from each other. Edge 51 is aligned with a boundary between sections 41 and 44, and edge 54 is aligned with a boundary between sections 44 and 45. Block 36 overlying section 46 of substrate 11 has edges 55 and 56 on the opposite sides thereof. Section 46 separates sections 42 and 45 of substrate 11 from each other. Edge 55 is aligned with a boundary between sections 45 and 46, and edge 56 is aligned with a boundary between sections 46 and 42. Block 37 overlying section 47 of substrate 11 has edges 52 and 57 on the opposite sides thereof. Section 47 separates sections 42 and 48 of substrate 11 from each other. Edge 52 is aligned with a boundary between sections 42 and 47, and edge 57 is aligned with a boundary between sections 47 and 48. Block 39 overlying section 49 of substrate 11 has edges 58 and 59 on the opposite sides thereof. Section 49 separates sections 43 and 48 of substrate 11 from each other. Edge 58 is aligned with a boundary between sections 48 and 49, and edge 59 is aligned with a boundary between sections 49 and 43.

Dichroic film 24 has refractive index different from one and, therefore, has a geometric thickness and an optical thickness different from each other. The optical thickness of dichroic film 24 is equal to its geometric thickness multiplied by its refractive index. Preferably, the optical thickness and the geometric thickness of dichroic film 24 differ from each other by an odd number multiple of one half wavelength of a light used in the photolithography process. In other words, if the light used in the photolithography process has a wavelength $\lambda$, the difference between the optical thickness and the geometric thickness is preferable equal to $\lambda/2$, $3\lambda/2$, $5\lambda/2$, etc. This can be achieved through adjusting the refractive index and geometric thickness of dichroic film 24. During the photolithography process, light transmitted through sections 41, 42, and 43 of substrate 11 passes through dichroic film 24 and has a phase difference of 180 degrees (°) compared with the light transmitted through sections 45 and 48 of substrate 11. This 180° phase shift creates a interference pattern and significantly increases the image resolution of light blocking structure 34 near edges 51 and 54 on the semiconductor wafer. The interference pattern also increases the image resolutions of light blocking structure 36 near edges 55 and 56, of light blocking structure 37 near edges 52 and 57, and of light blocking structure 38 near edges 58 and 59. Therefore, like photo mask 10 shown in FIG. 1, dichroic photo mask 20 is also a phase shift photo mask or, more specifically, an alternating phase shift photo mask. In addition, depressions 35 and 38 are also referred to as phase shifters.

By way of example, semiconductor device fabrications often use a deep ultraviolet light having a wavelength of 248 nm for photolithography. If dichroic film 24 has a refractive index of 2, its geometric thickness can be 124 nm, 372 nm, 620 nm, 868 nm, 1116 nm, etc.

In a preferred embodiment, interference film 24 is an optical interference film stack made of three interference films 21, 22, and 23 disposed over major surface 12 of substrate 11 using chemical vapor deposition, sputtering, or other processes known in the art. By way of example, each of films 21 and 23 are amorphous silicon nitride ($Si_3N_4$) films having a refractive index of approximately 2.3 and an optical thickness of $\lambda/4$, where $\lambda$ is the wavelength, e.g., approximately 248 nm, of the light used in the photolithography process. Further, film 22 is an amorphous silicon oxynitride ($SiO_xN_y$) film having a refractive index of approximately 1.9 and an optical thickness of $\lambda/2$. Consequently, dichroic interference film stack 24 has an effective refractive index of approximately 2, a total optical thickness of $\lambda$, and a total geometric thickness of $\lambda/2$. During a photolithography process using the deep ultraviolet light have the wavelength of approximately 248 nm, photo mask 20 with such a dichroic interference film stack 24 operates in a similar way as conventional phase shift photo mask 10 of FIG. 1.

It should be noted that the structure of dichroic photo mask 20 is not limited to being that described herein above. For example, dichroic film 24 is not limited to including three interference films as shown in FIG. 2. Dichroic film 24 can be a single layer film or a multiple layer stack that is made up of any number of layers e.g., two, four, five, six, etc. Dichroic film 24 is not limited to being completely etched away in depressions 35 and 38. In other words, major surface 12 of substrate 11 is not limited to being exposed over sections 45 and 48 of substrate 11. In an alternative embodiment, a thin layer of dichroic film 24 remains in depressions 35 and 38 after the etching. In this alternative embodiment, the geometric thickness of dichroic film 24 overlying sections 41, 42, and 43 of substrate 11 is preferably significantly greater than that of remaining dichroic film 24 overlying sections 45 and 48 of substrate 11. The different thicknesses ensure different transmittances to a light used in inspecting photo mask 20, thereby facilitating the identification of phase shifting patterns on photo mask 20. The optical thicknesses of dichroic film 24 over different sections of substrate 11 are preferably so related with each other that the light transmitted through photo mask 20 generates interference patterns on the semiconductor wafer during the photolithography process. The shape, size, and number of light blocking structures on photo mask 20 are determined by desired pattern to be transferred to the semiconductor wafer during the photolithography process, which may be different from blocks 34, 36, 37, and 39 shown in FIG. 2. In addition, the light blocking structures are not limited to be formed on dichroic film 24. They can be formed directly on major surface 12 of substrate 11.

Figure 3:
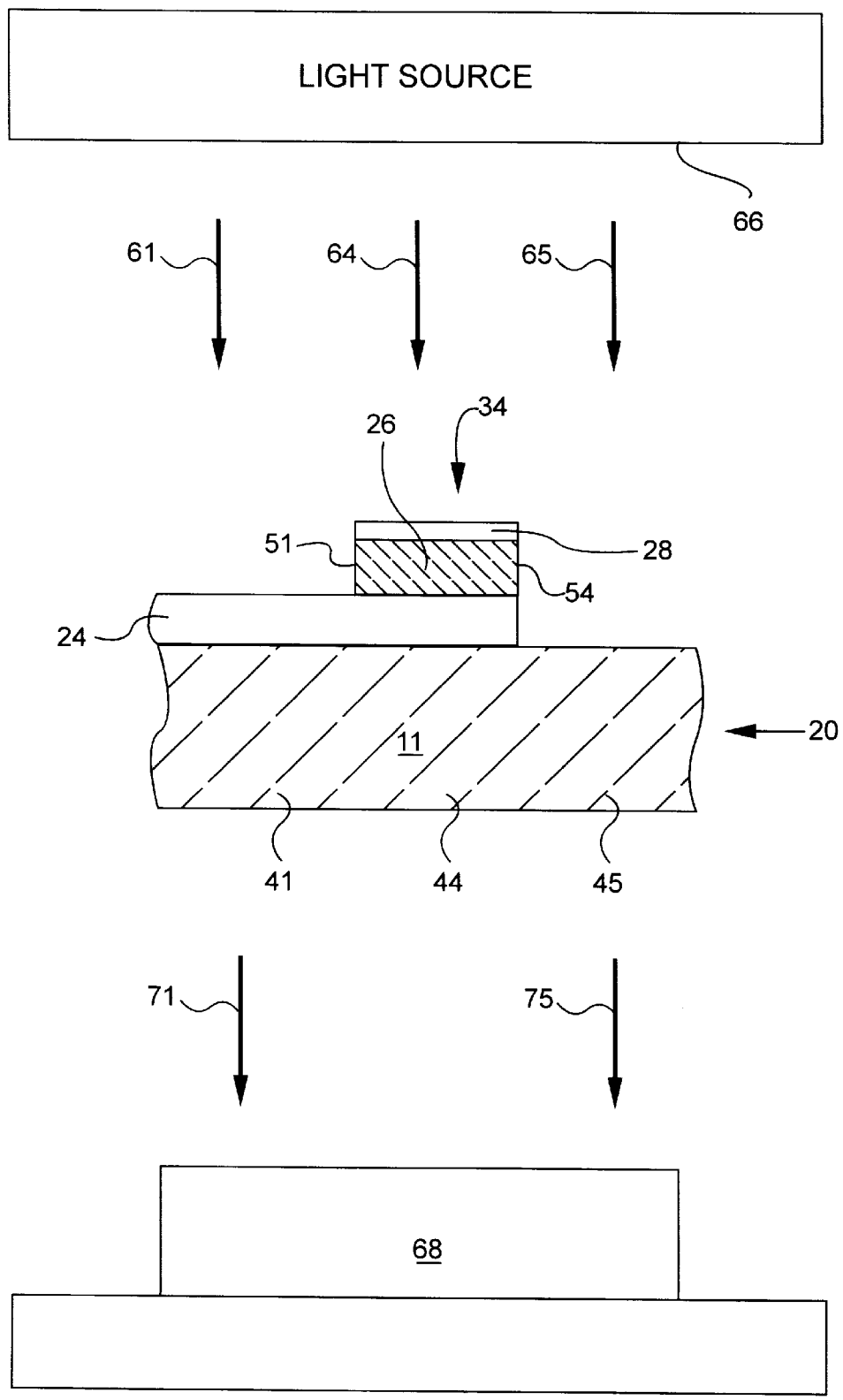
FIG. 3 schematically illustrates a method for inspecting a dichroic photo mask in accordance with the present invention.

FIG. 3 schematically illustrates a method for inspecting dichroic photo mask 20 in accordance with the present invention. For simplicity, FIG. 3 shows only a portion of photo mask 20 that includes light blocking structure 34 and sections 41, 44, 45 of substrate 11. Dichroic photo mask 20 is inspected using an inspection light emitted from a light source 66. A light detector 68, e.g., a camera, a microscope, etc., senses the intensity of the light emitted from light source 66 and transmitted through mask 20. Preferably, dichroic film 24 on mask 20 has a low transmittance, e.g., lower than approximately 60%, to the light emitted from light source 66. By way of example, light source 66 emits an ultraviolet light having a wavelength of approximately 365 nm and dichroic film 24 has a transmittance of approximately 50% to the ultraviolet light emitted from light source 66.

The process of inspecting dichroic photo mask 20 includes illuminating mask 20 with the ultraviolet light emitted from light source 66. FIG. 3 shows light beams 61, 64, and 65 as three representative incident light beams emitted from light source 66. Incident light beams 61, 64, and 65 have substantially the same intensity. Light beam 61 propagates toward section 41 of substrate 11 in mask 20. After transmitting through dichroic film 24 and section 41 of substrate 11, it propagates toward light detector 68 as a transmitted light beam 71 shown in FIG. 3. Because of the low transmittance of dichroic film 24 to the inspection light, the intensity of transmitted light beam 71 is significantly lower than that of incident light beam 61. Light beam 64 propagates toward section 44 of substrate 11 in mask 20 and is block by light blocking structure 34. Light beam 65 propagates toward section 45 of substrate 11 in mask 20. After transmitting through section 45 of substrate 11, it propagates toward light detector 68 as a transmitted light beam 75 shown in FIG. 3. Because substrate 11 has a high transmittance to the inspection light, the difference in between the intensities of transmitted light beam 75 and incident light beam 65 is minimal. Therefore, light detector 68 senses transmitted light beam 75 being significantly brighter than transmitted light beam 71. Therefore, the phase shifter pattern on mask 20 can be easily identified by observing the light transmitted through mask 20. The intensity of light transmitted through mask 20 reveals the patterns thereon. More particularly, the light transmitted through a portion, e.g., section 45, of mask 20 on which dichroic film 24 is etched to form phase shifters has a high intensity. On the other hand, the light transmitted though another portion, e.g., section 41, of mask 20 on which dichroic film 24 is intact has a low intensity. The light blocking structures, e.g., structure 34, on mask 20 obstruct the incident light, e.g., light beam 64. Thus, there is substantially no light transmitting through section 44 of substrate 11. Accordingly, sensing the intensity of inspection light transmitted through mask 20 can easily identify the patterns of phase shifters and opaque structures on dichroic photo mask 20. The patterns on mask 20 can be compared with a predetermined pattern of phase shifters and light blocking structures to determine whether mask 20 is defective.

By now it should be appreciated that a phase shift photo mask and methods for making and inspecting the phase shift photo mask have been provided. The phase shift photo mask of the present invention includes a dichroic film formed on a transparent substrate. The dichroic film is transparent to a light used in a photolithography process. The dichroic film is selectively etched to produce phase shift patterns, thereby increasing the image resolution of the photo mask on a target object such as, for example, a semiconductor wafer during the photolithography process. The dichroic phase shift photo mask of the present invention is simple, reliable, and easy to make. It is compatible with existing photolithography processes and can be used in a way similar to that of a conventional phase shift photo mask. On the other hand, the dichroic film on the photo mask has a low transmittance to a light used in inspecting the photo mask. Therefore, the phase shifters on the photo mask can be easily identified by sensing the intensity of light transmitted through the photo mask. Inspecting the photo mask of the present invention is simple, accurate, time efficient, and cost efficient.

What is claimed is:

1. A dichroic photo mask, comprising:
   a transparent substrate having a major surface;
   an opaque structure over a first section of said transparent substrate, said opaque structure having a first edge aligned with a boundary between the first section and a second section of said transparent substrate and a second edge aligned with a boundary between the first section and a third section of said transparent substrate; and
   a dichroic film over the major surface of said transparent substrate overlying at least the second section of said transparent substrate.

2. The dichroic photo mask of claim 1, wherein said dichroic film has a first transmittance to a first light having a first wavelength and a second transmittance to a second light having a second wavelength, the second transmittance being significantly lower than the first transmittance.

3. The dichroic photo mask of claim 2, wherein said dichroic film includes an optical interference film stack.

4. The dichroic photo mask of claim 3, wherein said optical interference film stack includes:
   a first interference film over the major surface of said transparent substrate; and
   a second interference film over said first interference film.

5. The dichroic photo mask of claim 4, wherein said optical interference film stack further includes a third interference film over said second interference film.

6. The dichroic photo mask of claim 5, wherein:
   said first interference film includes a first silicon nitride film;
   said second interference film includes a silicon oxynitride film; and
   said third interference film includes a second silicon nitride film.

7. The dichroic photo mask of claim 5, wherein:
   said first interference film has a refractive index of approximately 2.3 and an optical thickness of one quarter of the first wavelength;

said second interference film has a refractive index of approximately 1.9 and an optical thickness of one half of the first wavelength; and said third interference film has a refractive index of approximately 2.3 and an optical thickness of one quarter of the first wavelength.

8. The dichroic photo mask of claim 1, wherein said dichroic film further overlies the first section of said transparent substrate and underlies said opaque structure.

9. A dichroic photo mask, comprising:

a glass plate;

a dichroic film over a first portion and a second portion of said glass plate and having first transmittance at a first wavelength and a second transmittance at a second wavelength; and a light blocking structure over said dichroic film, overlying the second portion of said glass plate, and having a first edge aligned with a boundary between the first portion and the second portion of said glass plate and a second edge aligned with a boundary between the second portion and a third portion of said glass plate.

10. The dichroic photo mask of claim 9, said dichroic film including an optical interference film stack having an optical thickness of approximately one first wavelength and an effective refractive index of approximately two.

11. The dichroic photo mask of claim 9, said dichroic film including:

a first silicon nitride film over said glass plate;

a silicon oxynitride film over said first silicon nitride film; and a second silicon nitride film over said silicon oxynitride film.

12. The dichroic photo mask of claim 11, said first silicon nitride film and said second silicon nitride film being amorphous and having a refractive index of approximately 2.3; and said silicon oxynitride film being amorphous and having a refractive index of approximately 1.9.

13. The dichroic photo mask of claim 9, said light blocking structure defining an integrated circuit pattern.

14. The dichroic photo mask of claim 9, said light blocking structure including:

a chromium layer over said dichroic film; and a chromium oxide layer over said chromium layer.

15. A method for making a dichroic photo mask, comprising the steps of:

providing an amorphous quartz plate as a substrate;

forming a dichroic film over a major surface of the substrate;

forming a light blocking structure over a first portion of the substrate, the light blocking structure exposing the dichroic film overlying a second portion and a third portion of the substrate, the second portion and the third portion of the substrate being separated from each other by the first portion of the substrate; and selectively etching the dichroic film overlying the third portion of the substrate.

16. The method as claimed in claim 15, wherein the step of forming a dichroic film includes disposing a dichroic interference film stack over the major surface of the substrate.

17. The method as claimed in claim 16, wherein the step of forming a dichroic film includes the steps of:

depositing a first amorphous silicon nitride film over the substrate;

depositing an amorphous silicon oxynitride film over the first amorphous silicon nitride film; and depositing a second amorphous silicon nitride film over the amorphous silicon oxynitride film.

18. The method as claimed in claim 15, wherein the step of forming a dichroic film further includes adjusting an optical thickness of the dichroic film to one wavelength of a light used in conjunction with the dichroic photo mask in a photolithography process.

19. The method as claimed in claim 18, wherein the step of selectively etching the dichroic film includes exposing the major surface of the substrate overlying the third portion of the substrate.

20. The method as claimed in claim 15, wherein the step of forming a light blocking structure includes the steps of:

depositing a chromium layer over the dichroic film; and oxidizing a top portion of the chromium layer.

21. A method for inspecting a dichroic photo mask, comprising the steps of:

providing the dichroic photo mask comprised of a dichroic film over a transparent substrate and patterned to define a phase shifter on the transparent substrate;

illuminating the dichroic photo mask with an incident light; and identifying the phase shifter on the transparent substrate by observing light transmitted through the dichroic photo mask.

22. The method as claimed in claim 21, wherein the step of illuminating the dichroic photo mask includes illuminating the dichroic photo mask with an ultraviolet light having a wavelength of approximately 365 nanomters.

23. The method as claimed in claim 21, wherein the step of identifying the phase shifter on the transparent substrate includes the steps of:

identifying a pattern of the dichroic film on the transparent substrate by sensing an intensity of light transmitted through the dichroic photo mask; and comparing the pattern of the dichroic film on the transparent substrate with a predetermined phase shifter pattern.

24. The method as claimed in claim 21, wherein the step of identifying the phase shifter on the transparent substrate includes the steps of:

identifying an area through which a light of a first intensity is transmitted as a portion of the transparent substrate with the dichroic film thereon; and identifying an area through which a light of a second intensity greater than the first intensity is transmitted as a portion of the transparent substrate without the dichroic film thereon.

25. The method as claimed in claim 24, wherein:

the step of providing the dichroic photo mask further includes providing the dichroic photo mask having a light blocking structure over the transparent substrate; and the step of identifying the phase shifter further includes identifying an area that blocks the incident light as the light blocking structure.

* * * * *